United States Patent
Lee et al.

(10) Patent No.: US 7,671,451 B2
(45) Date of Patent: Mar. 2, 2010

(54) SEMICONDUCTOR PACKAGE HAVING DOUBLE LAYER LEADFRAME

(75) Inventors: Jason Lee, Seoul (KR); Geun Sik Kim, Sungnam (KR)

(73) Assignee: Chippac, Inc., Fremont, CA (US)

( * ) Notice: Subject to any disclaimer, the term of this patent is extended or adjusted under 35 U.S.C. 154(b) by 197 days.

(21) Appl. No.: 11/274,925

(22) Filed: Nov. 14, 2005

(65) Prior Publication Data
US 2006/0192274 A1   Aug. 31, 2006

Related U.S. Application Data

(60) Provisional application No. 60/627,637, filed on Nov. 12, 2004.

(51) Int. Cl.
  H01L 23/495   (2006.01)
  H01L 23/48   (2006.01)
(52) U.S. Cl. .................. 257/666; 257/676; 257/784; 257/787; 257/E23.042
(58) Field of Classification Search ................ 257/666, 257/787, 676, 784, E23.042
  See application file for complete search history.

(56) References Cited

U.S. PATENT DOCUMENTS

| | | | | |
|---|---|---|---|---|
| 5,631,809 A | * | 5/1997 | Takagi et al. | 361/820 |
| 6,730,544 B1 | * | 5/2004 | Yang | 438/110 |
| 6,737,750 B1 | * | 5/2004 | Hoffman et al. | 257/777 |
| 6,815,806 B1 | * | 11/2004 | Awad et al. | 257/666 |
| 6,876,068 B1 | * | 4/2005 | Lee et al. | 257/676 |
| 6,946,324 B1 | * | 9/2005 | McLellan et al. | 438/111 |
| 6,977,431 B1 | * | 12/2005 | Oh et al. | 257/696 |
| 7,009,286 B1 | * | 3/2006 | Kirloskar et al. | 257/684 |
| 7,060,536 B2 | | 6/2006 | Punzalan et al. | |
| 7,102,216 B1 | | 9/2006 | Foster | |
| 7,245,007 B1 | * | 7/2007 | Foster | 257/678 |
| 2006/0186515 A1 | | 8/2006 | Punzalan | |

* cited by examiner

Primary Examiner—Nitin Parekh

(57) ABSTRACT

A leadframe chip scale package includes a double leadframe assembly. The first leadframe has a central die paddle and peripheral leads, and the second leadframe, superimposed over the first leadframe in the package, has peripheral leads. The peripheral leads of both leadframes are situated in at least one row along an edge of the package, and in some embodiments in a row along each of the four edges of the package. The leads are patterned such that when the second leadframe is superimposed over the first leadframe, the leads do not contact each other; in a plan view, the leads of the first leadframe appear to be interdigitated with the leads of the second leadframe.

9 Claims, 7 Drawing Sheets

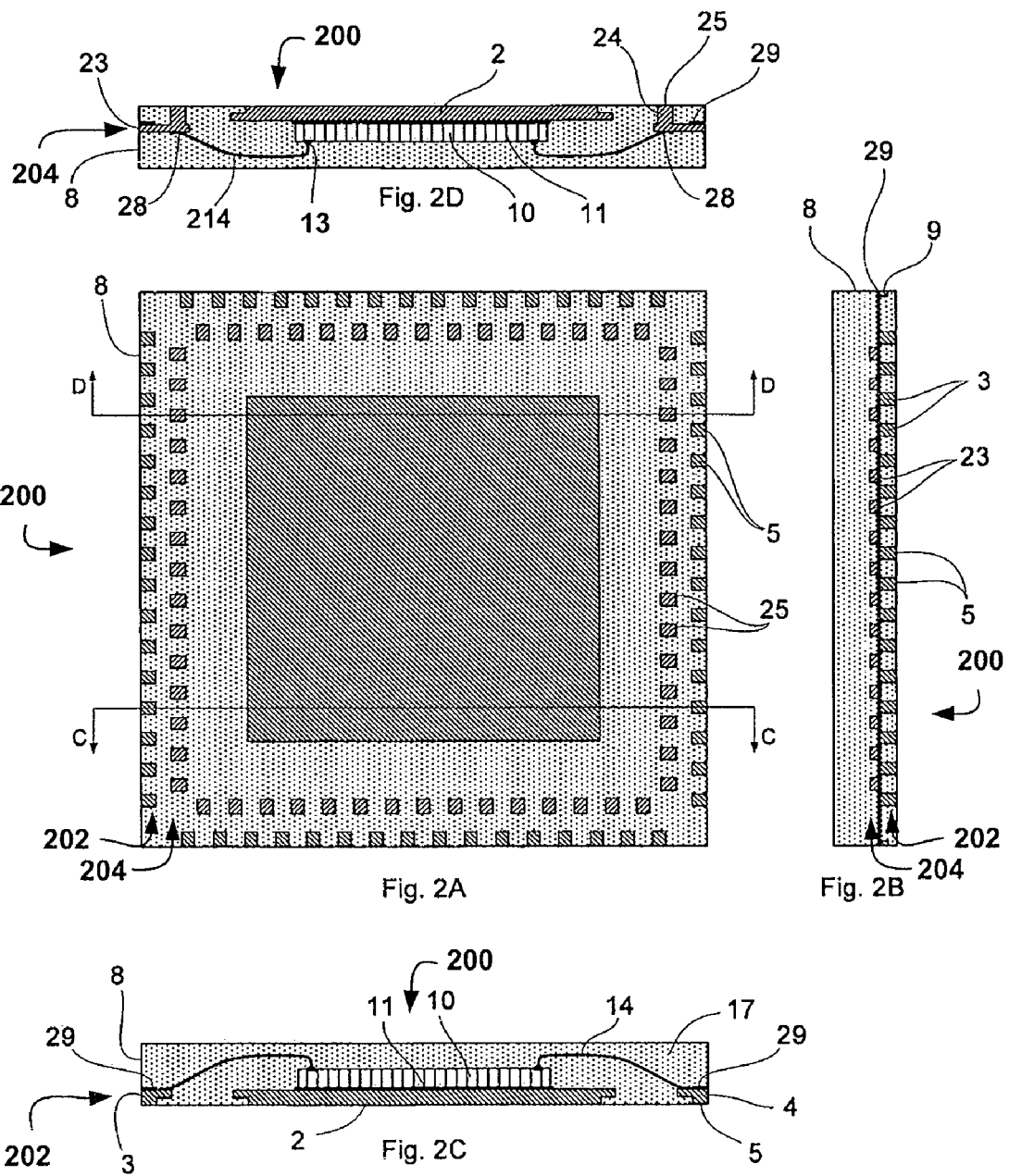

SEMICONDUCTOR PACKAGE HAVING DOUBLE LAYER LEADFRAME

CROSS-REFERENCE TO RELATED APPLICATIONS

This application claims the benefit of U.S. Provisional Application No. 60/627,637, filed Nov. 12, 2004, tiled "Double layer leadframe integrated circuit system", which is hereby incorporated by reference.

BACKGROUND

This invention relates to semiconductor packaging.

In a conventional lead frame package, a semiconductor die is mounted active side upward on a die attach part of a centrally situated die paddle, and the die is electrically connected to bond sites on peripherally situated leads by wire bonds. The assembly of die and leadframe and wires is then encapsulated with an encapsulant or molding compound to protect the die and wires. In a chip scale lead frame package, interconnection of the package (and, therefore, of the die) with circuitry in the environment in which it is deployed is made by way of the leads, and the encapsulation is carried out in such a way as to leave portions of the leads exposed for interconnection. The leadframe is made from a metal (such as copper) sheet by selective removal of the metal where it is not needed (such as by a patterned mask and etch, for example), leaving the die paddle and the peripheral leads. The number of input/output interconnections is limited by the pitch of the leads, and the lead pitch cannot in practice be made finer than a specified lower limit, owing principally to the thickness of the metal and to limitations imposed by the techniques used to pattern the leadframe.

Finer lead pitch can be obtained in a chip scale package by forming bumped or flat pads, in a so-called bump chip carrier (BCC). The BCC is made by plating thin metal layers onto a sacrificial metal (usually copper) base and then removing the base material after the thin bumps or pads have been formed. The additional steps in the BCC process make this kind of package much more costly to make than a standard leadframe.

SUMMARY

This invention features a leadframe chip scale package having a double leadframe assembly. A first leadframe includes a central die paddle and peripheral leads, and a second leadframe, superimposed over the first leadframe in the package, includes peripheral leads.

The first leadframe has a first side and a second side, which may be referred to as "upper" and "lower", without regard for the actual orientation of the package in use. On the first side of the first leadframe the die is attached to the die paddle, and wire bonds are attached to bond sites on the respective leads. On the second side of the first leadframe a portion of the die paddle may be left exposed following encapsulation, and input/output contact portions of the leads are left exposed for interconnection with circuitry in the environment of use.

The second leadframe also has a first side and a second side, which may be referred to as "upper" and "lower", without regard for the actual orientation of the package in use. On the first side of the second leadframe wire bonds are attached to bond sites on the respective leads, and on the second side of the second leadframe, input/output contact portions of the leads are left exposed.

The peripheral leads of both leadframes are situated in at least one row along an edge of the package, and in some embodiments in a row along each of the four edges of the package. The leads are patterned such that when the second leadframe is superimposed over the first leadframe, the leads do not contact each other; in a plan view, the leads of the first leadframe appear to be interdigitated with the leads of the second leadframe. The input/output contact portions of the first leadframe are exposed in a row (the row of first contacts) near or, usually, at the edge of the package, and the input/output contact portions of the second leadframe are exposed in a row (the row of second contacts) inboard from the row of first contacts. The contacts in the second row are staggered in relation to the contacts in the first row.

The first and second leadframes each can be made using conventional leadframe processes; then the second leadframe is aligned and superimposed over the first leadframe; then the wire bonds are formed between pads on the die and the respective bond sites in the leads; and then the assembly is encapsulated, leaving the peripheral first and second staggered rows of contacts exposed for interconnection at the lower side of the package.

In some embodiments, the second leadframe is affixed during assembly to the first leadframe by an adhesive, such as a thermosetting adhesive tape, between peripheral parts of the leadframes; and in some embodiments some of the adhesive may remain between the leadframes near the edges of the package.

In some embodiments of a method of making the package of the invention, a plurality of leadframe units are provided in a row or in an array on a strip or sheet of leadframe material. Following completion of the packages (including the encapsulation or molding), the individual packages are separated by punching or sawing.

The double leadframe package according to the invention provides nearly twice the number of input/output contacts as a standard leadframe package having the same dimensions, and made using the same leadframe patterning process.

The double leadframe package according to the invention can be used for building computers, telecommunications equipment, and consumer and industrial electronics devices.

BRIEF DESCRIPTION OF THE DRAWINGS

FIG. 2A is a diagrammatic sketch in a plan view showing the contact side ("lower") of a double lead frame chip scale package according to an embodiment of the invention.

FIG. 2B is a diagrammatic sketch in an elevational (edge-on) view showing a double lead frame chip scale package according to an embodiment of the invention as in FIG. 2A.

FIG. 2C is a sectional view thru a double lead frame chip scale package according to an embodiment of the invention as in FIG. 2A, the section being taken at C-C in FIG. 2A.

FIG. 2D is a sectional view thru a double lead frame chip scale package according to an embodiment of the invention as in FIG. 2A, the section being taken at D-D in FIG. 2A.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1A:
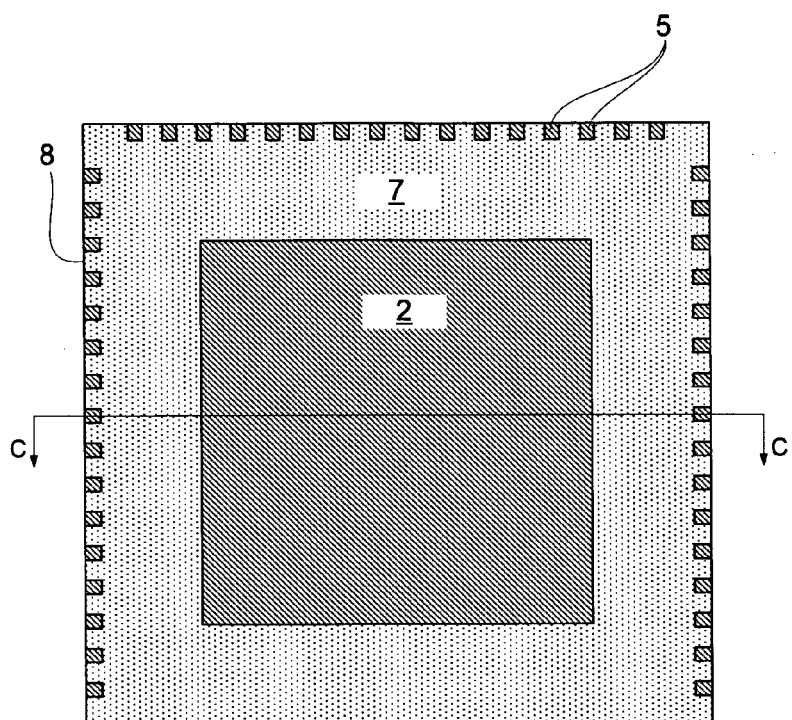
FIG. 1A is a diagrammatic sketch in a plan view showing the contact side ("lower") of a conventional lead frame chip scale package.
Figure 1B:
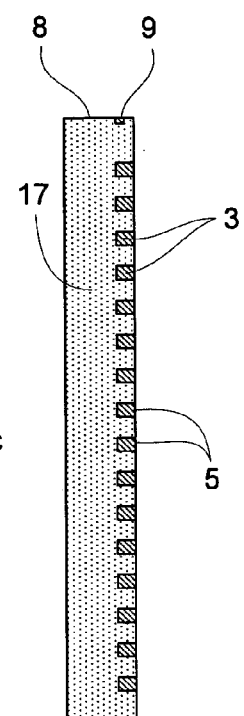
FIG. 1B is a diagrammatic sketch in an elevational (edge-on) view showing a conventional lead frame chip scale package as in FIG. 1A.
Figure 1C:
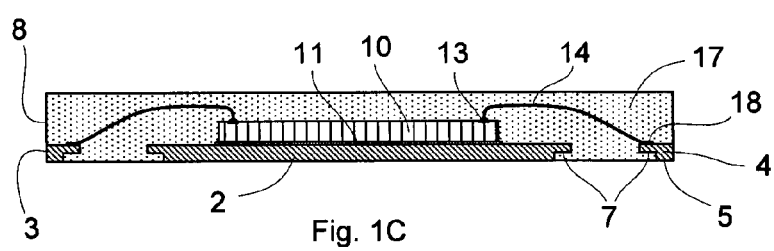
FIG. 1C is a sectional view thru a conventional lead frame chip scale package as in FIG. 1A, the section being taken at C-C in FIG. 1A.

Turning now to FIGS. 1A, 1B, 1C, a conventional chip scale lead frame package includes a die 10 attached to, and electrically connected with, a leadframe which includes a central die paddle 2 and peripheral leads 4. The leadframe (and its constituent parts) has a first ("upper") side and a second ("lower") side. A lower portion of the perimeter of the die paddle and lower inner portions of the leads, are partially removed to provide a step 7 ("partial etch"), which improves adhesion of the encapsulant to the leadframe. The die is affixed using a die attach adhesive 11 onto a die attach side of the die paddle 2. The peripheral leads 4 are arranged in rows along the edges 8 of the package. Wire bonds 14 connect pads 13 on the die with bond sites 18 on the upper sides of the leads. The lower sides 5 of the leads 4 are the contacts, for interconnection of the completed package to the environment of use. A molding or encapsulation covers all the components and features of the assembly except the contacts and a portion of the die paddle on the lower side of the package, and edge portions 3 of the leads and corner portions 9 of the tie bars which connect the die paddle to the frame during processing.

The lead pitch is affected by limitations in the process for patterning the leadframe and, accordingly, the number of input/output contacts that can be provided in the conventional lead frame package is limited.

FIGS. 2A, 2B, 2C, and 2D show a double lead frame package 200 according to the invention. The first leadframe 202 appears in sectional view in FIG. 2C, and exposed parts of the leads appear in the plan and edge-on views of FIGS. 2A and 2D, and, in this embodiment the first leadframe 202 is substantially like a conventional leadframe as in FIGS. 1A-1C.

The second leadframe 204 appears in sectional view in FIG. 2D. The second leadframe 204 includes peripheral leads 24 outside the outer perimeter of the die paddle 32 and arranged in rows along the edges 8 of the package. Wire bonds 214 connect pads 13 on the die with bond sites 28 on the upper (the package appears inverted in FIG. 2D). The lower sides 25 of the leads 24 are the second leadframe contacts, for interconnection of the completed package to the environment of use.

The second leadframe 204 is affixed to the first leadframe 202 by an adhesive 29, such as a thermoset (e.g., polyimid) tape adhesive, which may in some embodiments be removed when the package is separated from the frame in the singulation step during processing. Where any of the tape remains between the first and second leadframe leads 202 and 204, the adhesive must be electrically insulating.

A molding or encapsulation covers all the components and features of the assembly except the contacts 5, 25 and a portion of the die paddle on the lower side of the package, and edge portions 3, 23 of the leads and corner portions 9 of the tie bars which connect the die paddle to the frame during processing.

Figure 3:
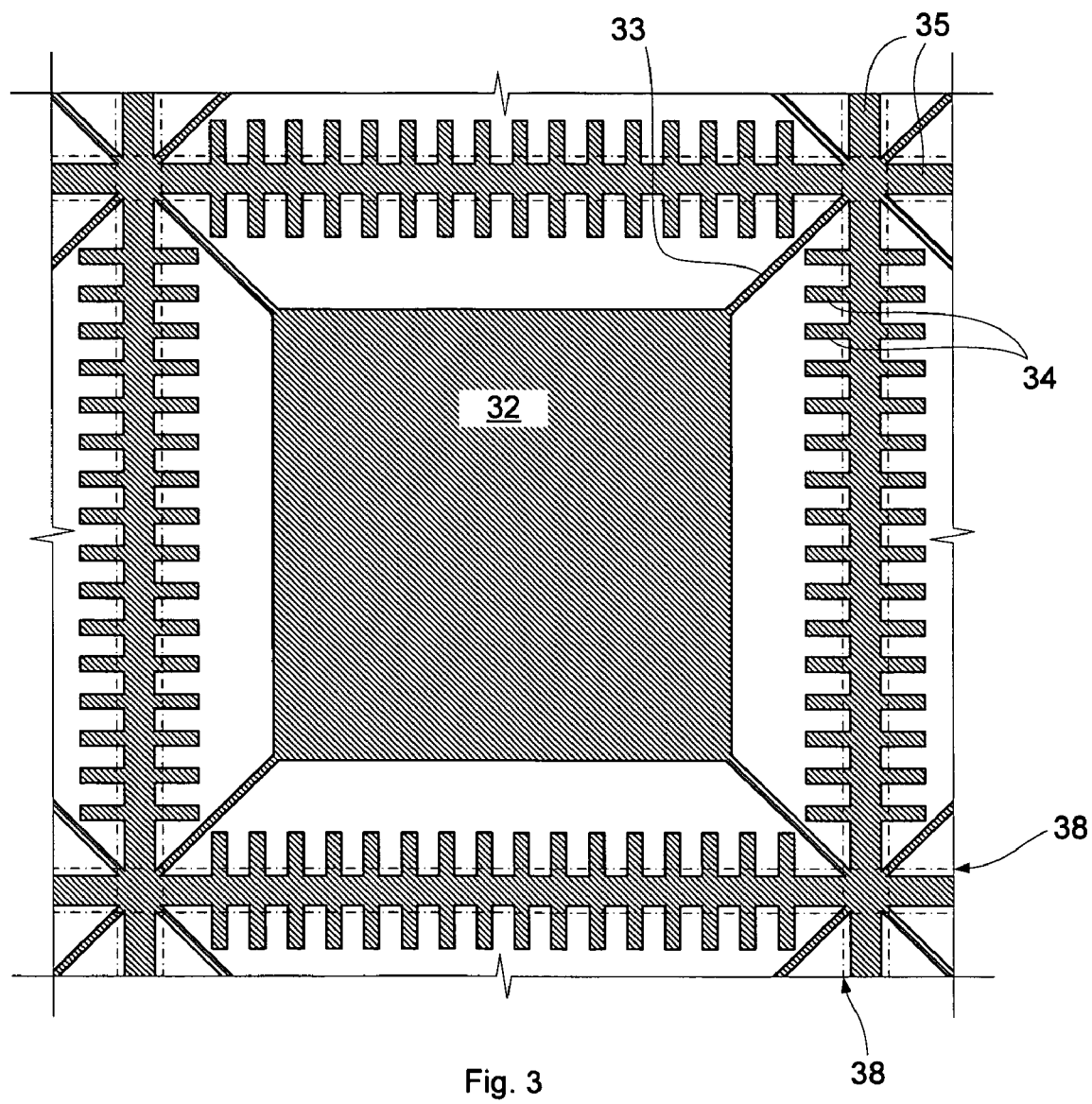
FIG. 3 is a diagrammatic sketch in a plan view showing a first leadframe unit according to an embodiment of the invention.

A first leadframe unit is shown in detail in FIG. 3. The unit includes a die paddle 32 connected by tie bars 33 to the corners of a support frame 35, which also supports rows of leads 34 outside the outer perimeter of the die paddle 32. When assembly is complete, the package will be separated from the frame by severing it (by punching or sawing, for example) from the frame along the broken lines 38. As a result, the leads are separate from one another in rows at the edge of the package, and the die paddle is separate from the remainder of the leadframe.

Figure 4:
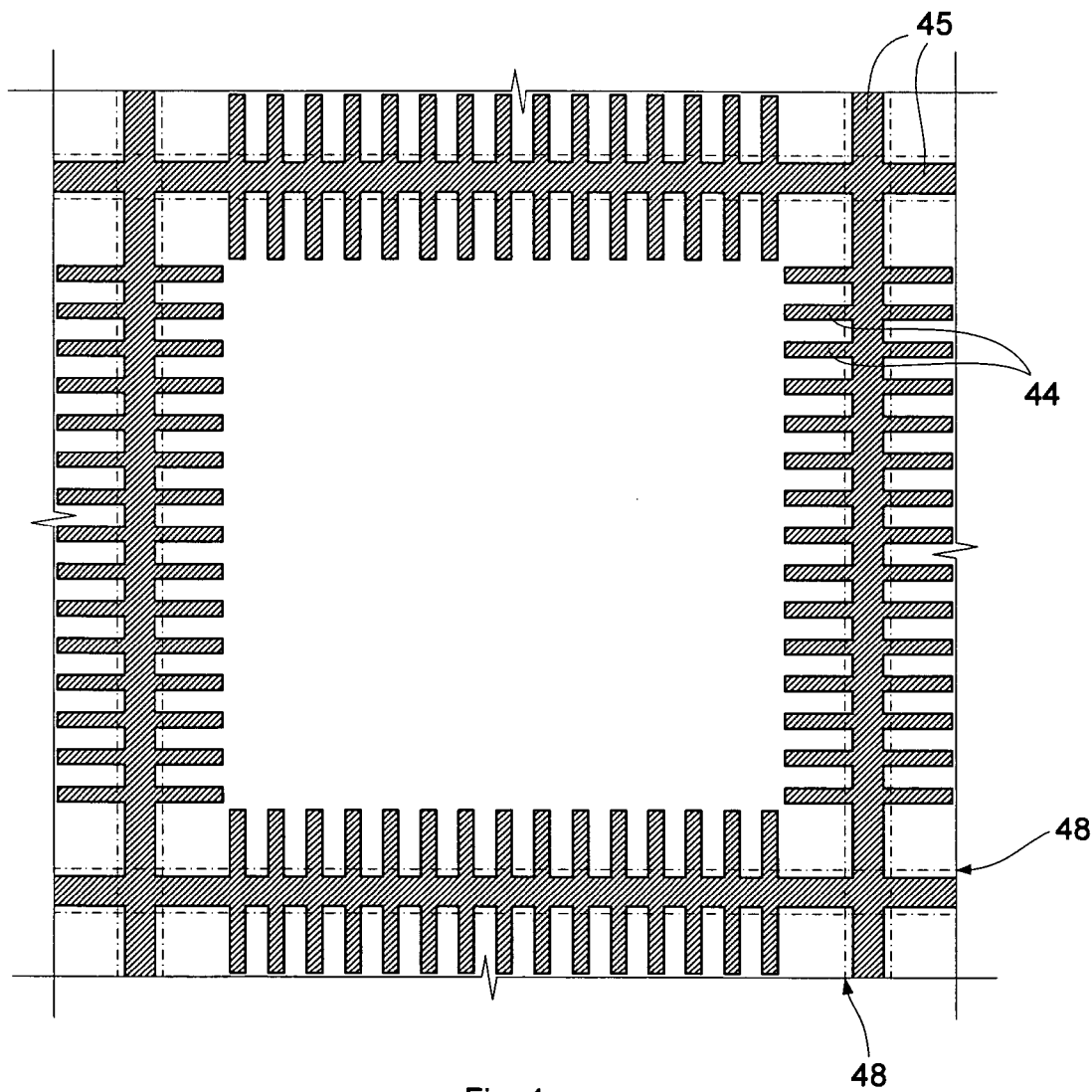
FIG. 4 is a diagrammatic sketch in a plan view showing a second leadframe unit according to an embodiment of the invention.
Figure 5:
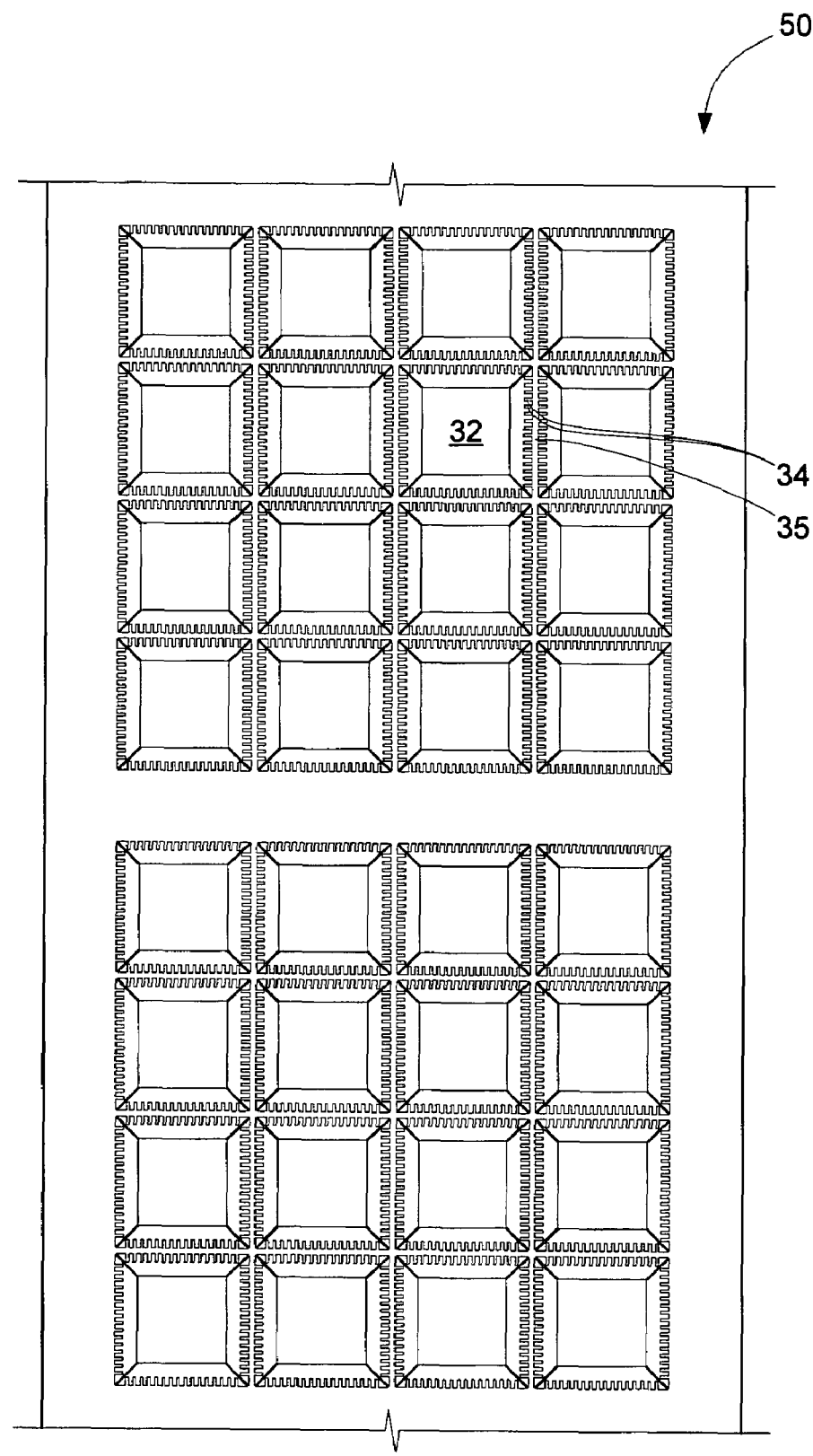
FIG. 5 is a diagrammatic sketch in a plan view showing an array of first leadframe units in a metal sheet.
Figure 6:
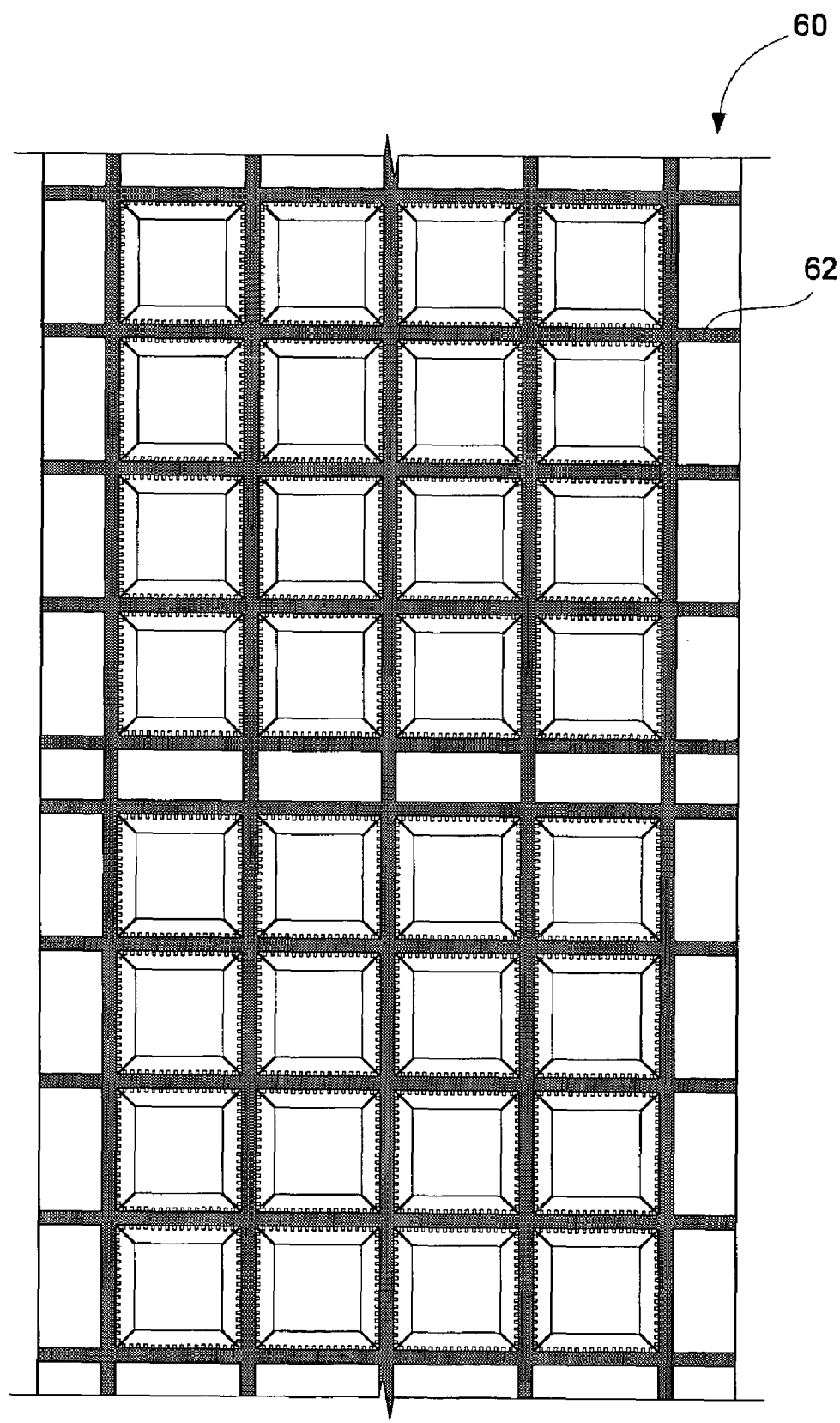
FIG. 6 is a diagrammatic sketch in a plan view showing the array of first leadframe units as in FIG. 5, with a patterned tape adhesive in place.
Figure 7:
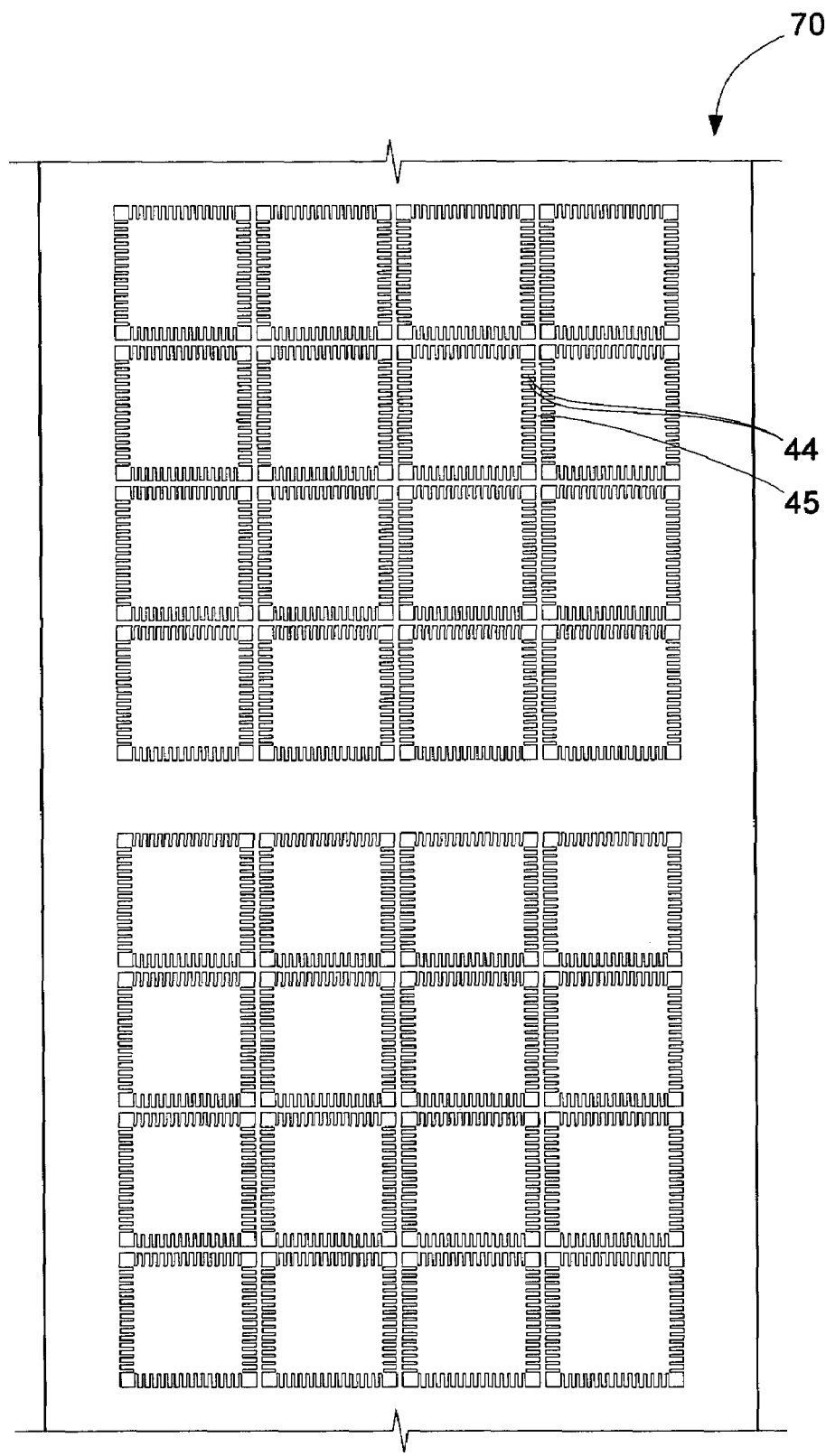
FIG. 7 is a diagrammatic sketch in a plan view showing an array of second leadframe units in a metal sheet, ready for alignment, superimposition over, and attachment by way of the adhesive tape to the array of first leadframe units as in FIG. 6.

A second leadframe unit is shown in detail in FIG. 4. The unit includes a support frame 45, which supports rows of leads 44. Again, when assembly is complete, the package will be separated from the frame by severing it (by punching or sawing, for example) from the frame along the broken lines 48. As a result, the leads are separate from one another in rows at the edge of the package, and the die paddle is separate from the remainder of the leadframe.

The leads 44 and 45 are arranged so that, when the second leadframe is aligned over the first leadframe, the leads 44 appear in a plan view to be between adjacent leads 45. Moreover, as shown in FIGS. 2A-2D, the contact portions of the second row of leads is situated inboard from the first row of leads.

The double leadframe package can be made according to the invention using equipment and process steps much as for a conventional leadframe package. Stages of the process according to the invention include providing a first leadframe having a die paddle and leads; providing a second leadframe having leads; providing an adhesive on a surface of one of the leadframes; aligning the leadframes (the second leadframe over the first leadframe); adhering the leadframes at the adhesive; wire bonding to connect the die to the double leadframe by connecting alternate pads on the die ($1^{st}$, $3^{rd}$, $5^{th}$, etc.) with bond sites on one of the leadframes and by connecting the other pads on the die ($2^{nd}$, $4^{th}$, $6^{th}$, etc.) with bond sites on the other one of the leadframes; encapsulating; and singulating.

In some embodiments where the adhesive is a thermoset adhesive, after the second and first leadframes are aligned and then brought into contact, they are pressed together and heated to cure the adhesive. As may be appreciated the adhesive is not required once the encapsulation has been completed and, accordingly, in some embodiments the adhesive is applied to areas of the leadframe unit that will be severed away during singulation. The adhesive must in any event be thick enough to permit the encapsulant to flow between closely situated surfaces of the first and second leads.

The first and second leadframes are provided as leadframe units in which the die paddle and leads (in the first leadframe) and the leads (in the second leadframe) are supported by frames. Singulation is completed by severing the package along lines that separate the die paddle and leads from the first supporting frame, and that separate the leads from the second supporting frame. Preferably the first and second leadframes are provided as a plurality of leadframe units in a row or an array in a strip or sheet of leadframe material.

Other embodiments are within the following claims.

We claim:

1. A leadframe package comprising a double leadframe assembly wherein a first lead frame has a central die paddle and peripheral leads outside the outer perimeter of and coplanar with the central die paddle having input/output contact portions of the first leadframe exposed in a row of first contacts at an edge and a bottom of the package and wherein a second lead frame has peripheral leads outside the outer perimeter of the central die paddle having bottom surfaces being coplanar with that of the central die paddle and input/output contact portions of the second leadframe exposed at a bottom of the package in a row of second contacts inboard from the row of first contacts.

2. The package of claim 1 wherein the double leadframe assembly comprises the second leadframe, superimposed over the first leadframe in the package, having the peripheral leads.

3. The package of claim 2 wherein the peripheral leads of the leadframes are situated in at least one row along an edge of the package.

4. The package of claim 3 wherein the peripheral leads of the leadframes are situated in a row along each of the four edges of the package.

5. The package of claim 2 wherein the leads are patterned such that when the second leadframe is superimposed over the first leadframe, the leads do not contact each other.

6. The package of claim 5 wherein in a plan view the leads of the first leadframe are interdigitated with the leads of the second leadframe.

7. The package of claim 2 wherein contacts in the row of second contacts are staggered in relation to contacts in the row of first contacts.

8. The package of claim 2 wherein the input/output contact portions of the first leadframe are exposed in a row of first contacts at the edge of the package.

9. An electronic device comprising the package of claim 1.

* * * * *